(12) United States Patent
Rose

(10) Patent No.: US 7,098,646 B2
(45) Date of Patent: Aug. 29, 2006

(54) RADIO FREQUENCY POWER GENERATION AND POWER MEASUREMENT

(75) Inventor: Ian Michael Rose, Maidenhead (GB)

(73) Assignee: Racal Instruments Wireless Solutions Limited, Slough (GB)

( * ) Notice: Subject to any disclaimer, the term of this patent is extended or adjusted under 35 U.S.C. 154(b) by 0 days.

(21) Appl. No.: 10/504,682

(22) PCT Filed: Feb. 18, 2003

(86) PCT No.: PCT/GB03/00701

§ 371 (c)(1),
(2), (4) Date: Apr. 19, 2005

(87) PCT Pub. No.: WO03/071296

PCT Pub. Date: Aug. 28, 2003

(65) Prior Publication Data

US 2005/0174234 A1    Aug. 11, 2005

(30) Foreign Application Priority Data

Feb. 20, 2002    (GB) ................................. 0204013.7

(51) Int. Cl.
*G01R 23/04* (2006.01)
*G01R 27/04* (2006.01)
(52) U.S. Cl. ........................................ 324/95; 324/642
(58) Field of Classification Search ................... 324/95, 324/771, 76.14, 646, 332, 76.11, 637, 639, 324/642, 175; 73/1.44, 54.25, 152.14, 514.19
See application file for complete search history.

(56) References Cited

U.S. PATENT DOCUMENTS 4,758,775 A * 7/1988 Roos ........................... 324/642
4,820,047 A * 4/1989 Snyder ........................ 356/484
5,307,284 A * 4/1994 Brunfeldt et al. ............. 702/76
5,373,237 A   12/1994 Imperato
6,147,481 A   11/2000 Mazzochette et al.
6,215,448 B1 * 4/2001 DaSilva et al. ............. 343/703
6,268,735 B1   7/2001 Craig et al.
6,313,644 B1  11/2001 Kim et al.
6,801,767 B1 * 10/2004 Schwartz et al. ........ 455/426.2
6,859,283 B1 * 2/2005 Arbore et al. .............. 356/477

FOREIGN PATENT DOCUMENTS

| EP | 104 748 | 4/1984 |
|----|---------|--------|
| EP | 1 037 060 | 9/2000 |
| GB | 2 209 841 | 5/1989 |

* cited by examiner

*Primary Examiner*—Anjan Deb
*Assistant Examiner*—Hoai-An D. Nguyen
(74) *Attorney, Agent, or Firm*—Leydig, Voit & Mayer, Ltd.

(57) ABSTRACT

A radio frequency power generation and power measurement system includes power sensors to measure both the radio frequency (RF) power transmitted by radio equipment under test, and the RF power received by the radio equipment under test. Power sensors are mounted in a separate assembly remote from the main power measurement and generation. The RF power sensors and other components in the remote assembly are interconnected to allow measurement of both received and transmitted RF power at the RF connector or connectors of the radio equipment under test. The main assembly and the remote assembly are connected by a flexible link.

13 Claims, 2 Drawing Sheets

RADIO FREQUENCY POWER GENERATION AND POWER MEASUREMENT

FIELD OF THE INVENTION

This invention relates to the generation and measurement of radio frequency (RF) power.

BACKGROUND

When measuring RF power, it is necessary to define the physical point in the system at which the measurement is made. This is because the transmission of RF power, whether through space, waveguide, or coaxial transmission lines is subject to loss. RF power measured in one place is only an accurate measure of RF power at another place to the extent that the transmission losses are known.

For this reason, equipment for measuring RF power often separates the RF power sensing element from the measuring equipment, so that the sensing element can be remote. The advantage of this arrangement is that whilst the full RF power measurement equipment may be large, the power sensing element can be made small and connected directly to the unit under test.

FIG. 1 shows a known example of this technique.

When generating RF power, it is also necessary to define the physical point in the system at which the output power is specified. As stated before, the transmission of RF power is subject to loss. RF power generated at one place is only an accurate measure of RF power generated at another place to the extent that the transmission losses are known.

For this reason, equipment for generating known RF power is sometimes used with a remote RF power sensing element, which may be connected to a separate means of power measurement, or may form part of a feedback loop which controls the RF power generation equipment. Such a system provides a signal source whose RF power at a defined point is determined by the accuracy of the remote sensor and the coupling device. The advantage is that whilst the full RF power generation equipment may be large, the power sensing element and coupling device can be made small, and connected directly to the unit under test.

FIG. 2 shows a known example of this technique.

Radio communication equipment often has either a single RF connector for transmission and reception, or one RF connector for transmission and another for reception. When characterising such equipment it is required both to measure the RF power transmitted by the unit under test, and to set the RF power received by the unit under test. It is usual to specify both powers at the RF connector or connectors of the unit under test.

SUMMARY OF THE INVENTION

According to the invention there is provided an RF power generation and measurement system for supplying RF power to, and measuring RF power transmitted by a unit under test via at least one RF connector of the unit, the system comprising, a main part, and a remote part connected to the main part by a link and being connectable to said RF connector of the unit under test, wherein said main part includes RF power generation means for supplying RF power to said unit under test via said link, said remote part and said RF connector, said remote part includes sensor means for sensing RF power received from said unit under test via said RF connector and for sensing RF power indicative of said RF power supplied to the unit under test at said RF connector, and said RF power generation means is controlled in response to an output of said sensor means whereby RF power supplied to the unit under test at said RF connector has a predetermined value.

Embodiments of the invention enable both measurement of RF power transmitted by the unit under test at the RF connector and setting of the RF power received by the unit under test at the RF connector. Those components of the system which need to be near the RF connector or connectors are fitted in a small remote assembly. The majority of the system components are in a larger main assembly, allowing freedom in the location of this part. The two parts of the system are connected by a link, preferably a flexible link.

BRIEF DESCRIPTION OF DRAWING FIGURES

DETAILED DESCRIPTION

A specific embodiment of the invention will now be described, by way of example, with reference to FIG. 3 of the accompanying drawings which shows an RF power generation and measurement system according to the invention.

Figure 1:
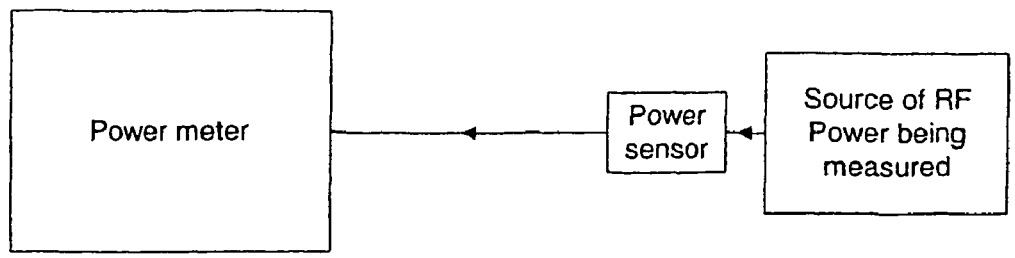
FIG. 1 shows an example of a known power measurement technique.
Figure 2:
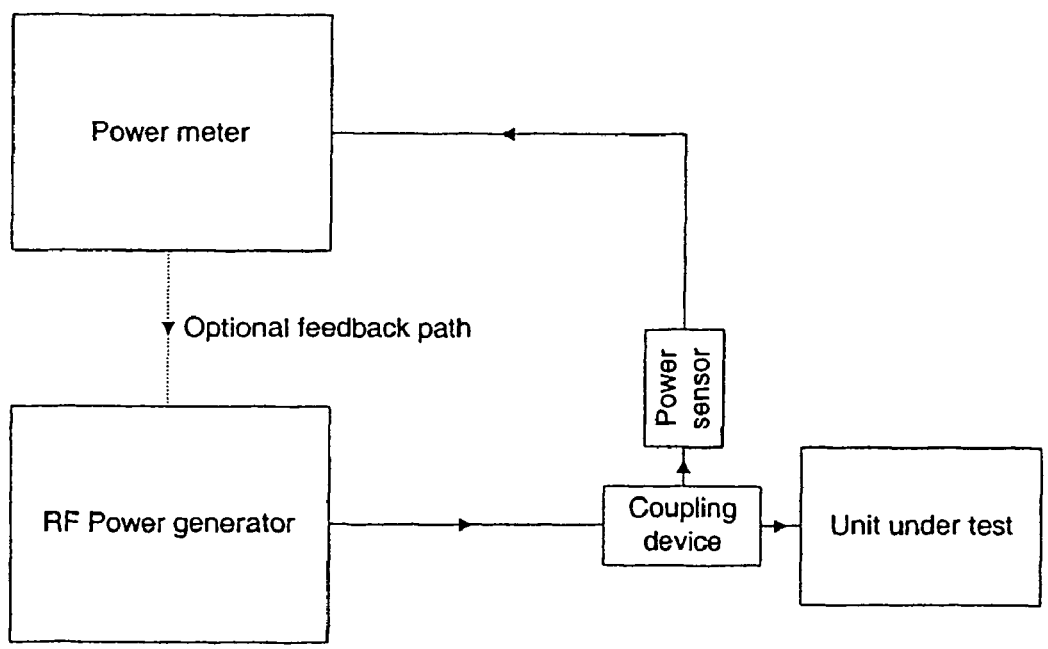
FIG. 2 shows an example of a known power measurement technique.
Figure 3:
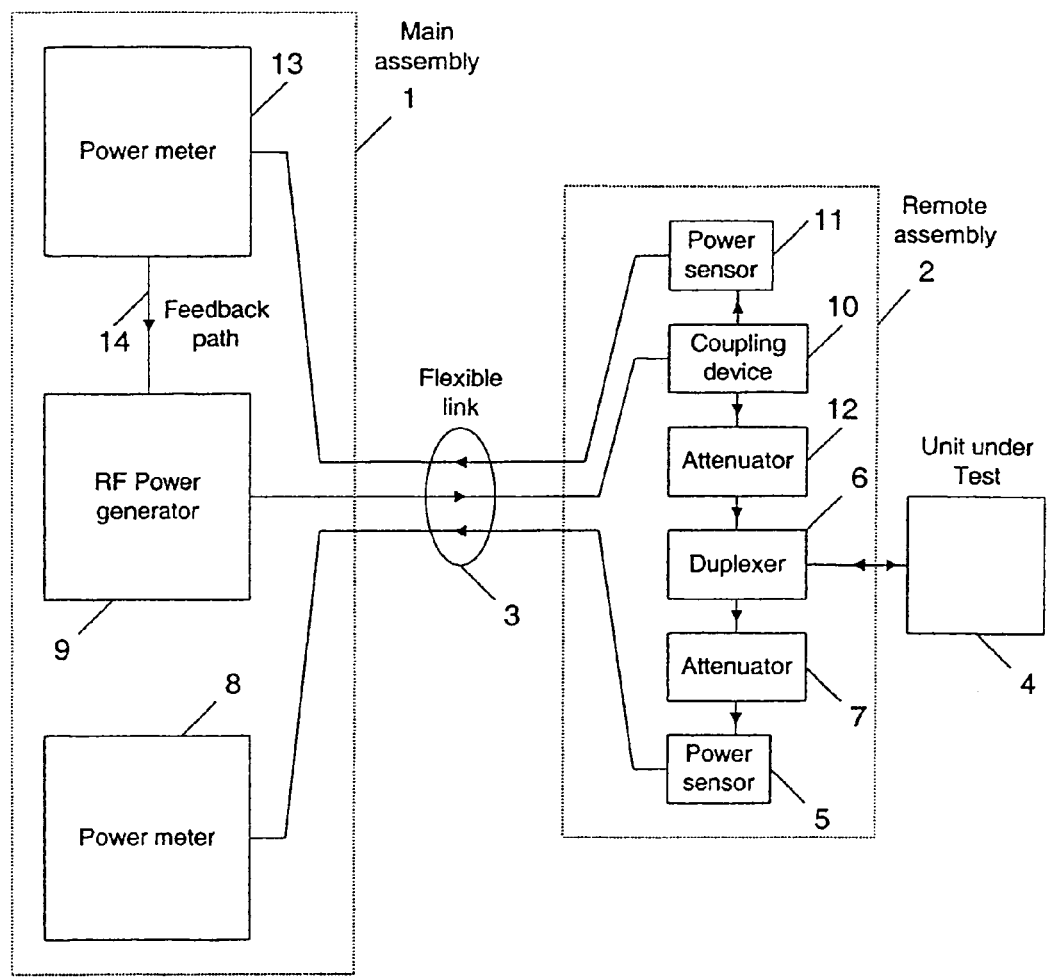
FIG. 3 illustrates an embodiment of a power generation and measurement system according to the invention.

Referring to FIG. 3, the system comprises a main assembly part 1 including an RF power generator 9 and power meters 8,13, and a remote assembly part 2 connectable to the RF connector of a unit under test 4 (which may be a mobile communications terminal, for example). The main and remote assembly parts are interconnected by a flexible link 3. RF power is supplied to, and received from the unit under test by a duplexer 6 in the remote assembly part 2. The remote assembly part 2 also includes a first RF power sensor 5 connected to duplexer 2 via an attenuator 7 and a second RF power-sensor 11 connected to an RF coupling device 10, for example a directional coupler or a power splitter, which is also connected to duplexer 6 via a fixed or settable attenuator 12.

RF power transmitted by the unit under test 4 is measured using the first RF power sensor 5. The duplexer 6 directs at least some of the power transmitted by the unit under test 4 to the power sensor 5 via the attenuator 7. The attenuator 7 is chosen so that the power sensor 5 receives RF power within its measurement range. The duplexer 6, the attenuator 7 and the power sensor 5 are all fitted within the remote assembly 2, to allow them to be connected close to the RF connector of the unit under test 4. The electrical output of the power sensor 5 is connected via the flexible link 3 to the power meter 8 fitted within the main assembly part 1. Transmission loss through the duplexer 6 and the attenuator 7 can be characterised, and is used by power meter 8 to give a measurement of RF power transmitted by the unit under test 4 at its RF connector.

The signal to be received by the unit under test is supplied by the RF power generator 9 in the main assembly part 1. It passes through the flexible link 3, and into the coupling device 10. The coupling device 10 allows a predetermined fraction of the RF power to reach the power sensor 11, and another predetermined fraction to reach the RF connector of the unit under test 4 via the attenuator 12 and the duplexer 6. The coupling device 10, the attenuator 12 and the power sensor 11 are all fitted within the remote assembly part 2, to allow them to be connected close to the RF connector of the unit under test 4. The electrical output of the power sensor 11 is connected via the flexible link 3 to the power meter 13 fitted within the main assembly part 1. The RF transmission characteristics of the coupling device 10, and loss through the attenuator 12 and the duplexer 6 can be characterised and used by power meter 13 to give a measurement of RF power received by the unit under test 4 at its RF connector. The value reported by power meter 13 is used to correct the output level of the RF power generator 9 via a feedback path 14.

The characteristics of the duplexer 6 and the coupling device 10, and the value of the attenuator 12, are chosen so that the power sensor 11 is not significantly affected by the RF power transmitted by the unit under test 4. Likewise the characteristics of the duplexer 6 and the value of the attenuator 7 are chosen so that the power sensor 5 is not significantly affected by the RF power transmitted by the RF power generator 9.

It will be appreciated that the electrical outputs of one or both power sensors 5,11 need not necessarily be supplied to power meters located in the main assembly part 1. Alternatively, these outputs could be supplied to separate metering apparatus remote from the main assembly part 1.

In an alternative implementation, a single power sensor means may be used to perform the functions of power sensor 5 and power sensor 11, for example by being switched between the output of attenuator 7 and the coupling device 10.

The invention claimed is:

1. An RF power generation and measurement system supplying RF power to, and measuring RF power transmitted by, a unit under test, via at least one RF connector of the unit, the system comprising;
    a main part, and
    a remote part connected to the main part by a link and being connectable to said RF connector of the unit under test, wherein
        said main part includes RF power generation means for supplying RF power to the unit under test via said link, said remote part, and said RF connector,
        said remote part includes sensor means for sensing RF power received from the unit under test via said RF connector and for sensing RF power indicative of the RF power supplied to the unit under test at said RF connector, and
        said RF power generation means is controlled in response to an output of said sensor means, whereby RF power supplied to the unit under test at said RF connector has a predetermined value.

2. The system as claimed in claim 1 wherein said sensor means comprises a first RF power sensor for sensing the RF power received from the unit under test via said RF connector and a second RF power sensor for sensing the RF power indicative of the RF power supplied to the unit under test at said RF connector.

3. The system as claimed in claim 1 wherein said remote part includes means for routing to the unit under test a predetermined fraction of RF power received from said RF power generation means via said link.

4. The system as claimed in claim 3 wherein said means for routing is a power splitter.

5. The system as claimed in claim 3 wherein said means for routing is a directional coupler.

6. The system as claimed in claim 3 wherein said remote part includes a first attenuator and said means for routing is arranged to route the predetermined fraction of RF power to the unit under test via said first attenuator.

7. The system as claimed in claim 3 wherein said means for routing is arranged to route to said sensor means another predetermined fraction of the RF power received from said RF power generation means via said link.

8. The system as claimed in claim 6 wherein said remote part includes a second attenuator and said sensor means receives the RF power from the unit under test via said second attenuator.

9. The system as claimed in claim 1 wherein said remote part includes a duplexer for both supplying RF power to, and receiving RF power from, the unit under test via the same RF connector of the unit.

10. The system as claimed in claim 1 wherein said main part includes first power metering means for receiving via said link a first output of said sensor means representing RF power received from the unit under test via said RF connector and processing the first output to derive a measure of RF power transmitted by the unit under test at said RF connector.

11. The system as claimed in claim 10 wherein said main part includes second power metering means for receiving via said link a second output of said sensor means representing RF power indicative of the RF power supplied to the unit under test and processing the second output to derive a measure of RF power supplied to the unit under test at said RF connector.

12. The system as claimed in claim 11 wherein said second power metering means controls said RF power generation means in response to the second output of said sensor means, whereby the RF power supplied to the unit under test at said RF connector has the predetermined value.

13. The system as claimed in claim 1 wherein said link is a flexible link.

* * * * *